United States Patent [19]

Kallweit

[11] Patent Number: 4,846,202

[45] Date of Patent: Jul. 11, 1989

[54] DEVICE FOR CLEANING OR CHEMICAL TREATMENT OF WORKPIECES

[75] Inventor: Manfred Kallweit, Berlin, Fed. Rep. of Germany

[73] Assignee: Schering Aktiengesellschaft, Berlin and Bergkamen, Fed. Rep. of Germany

[21] Appl. No.: 162,492

[22] Filed: Feb. 22, 1988

[30] Foreign Application Priority Data

Feb. 25, 1987 [DE] Fed. Rep. of Germany ... 8703114[U]

[51] Int. Cl.⁴ ............................................... B08B 3/02
[52] U.S. Cl. ............................. 134/122 R; 134/198; 239/553.3; 239/568
[58] Field of Search .................. 239/552, 553.3, 553.5, 239/558, 568; 134/64 R, 68, 72, 122 R, 131, 151, 198

[56] References Cited

U.S. PATENT DOCUMENTS

| | | | |
|---|---|---|---|
| 2,026,027 | 12/1935 | Evans | 239/568 |
| 2,295,522 | 9/1942 | Shorter | 239/553.3 |
| 2,414,874 | 1/1947 | Herbst | 239/553.3 X |
| 3,682,185 | 8/1972 | Murry et al. | 134/122 R |
| 3,687,145 | 8/1972 | Schrader et al. | 134/122 R X |
| 4,076,222 | 2/1978 | Schaming | 134/64 R X |
| 4,161,285 | 7/1979 | Matheny et al. | 239/568 X |
| 4,227,550 | 10/1980 | Bauer et al. | 134/198 X |
| 4,367,597 | 1/1983 | Iida et al. | 134/122 R X |

Primary Examiner—Frankie L. Stinson
Attorney, Agent, or Firm—Michael J. Striker

[57] ABSTRACT

A device for cleaning or chemically treating workpieces, particularly printed circuit boards with solutions applied to the workpieces by nozzles comprises a two-part housing, the lower portion of which is supplied with a treatment solution and is communicated with the upper part which is subdivided into two chambers by a separating wall. Each chamber is limited from the upper wall of the housing by a flat perforated wall through which the solution flows to the nozzles formed by elongated slots.

8 Claims, 2 Drawing Sheets

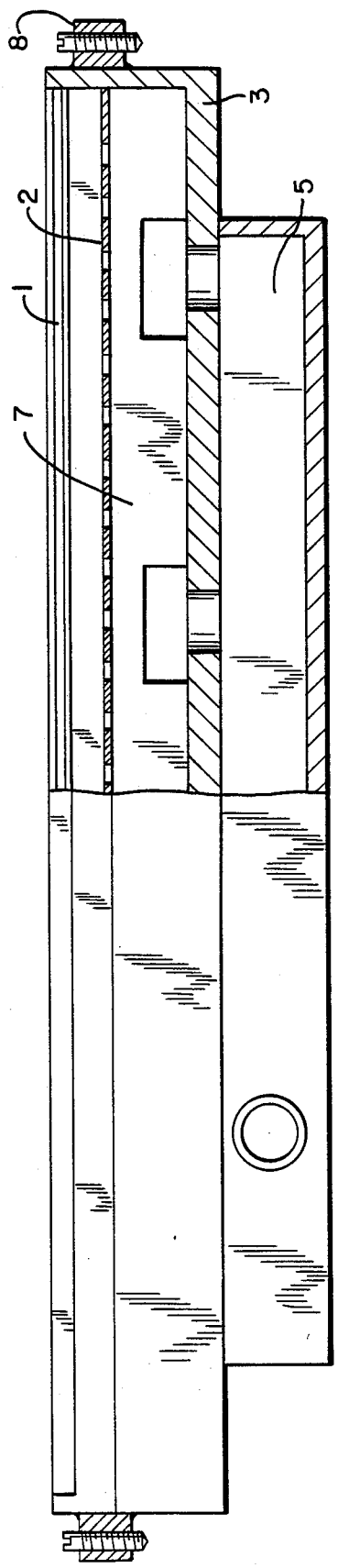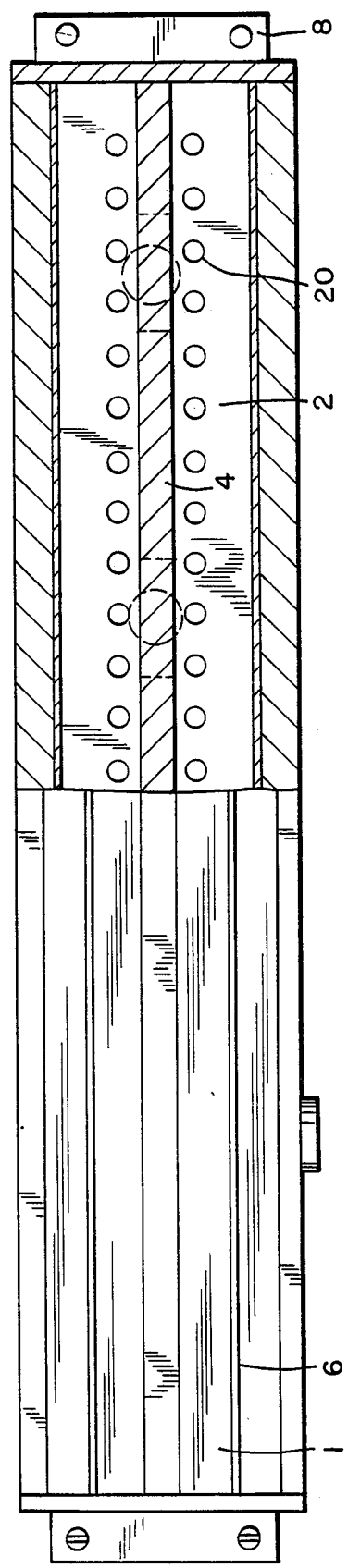

DEVICE FOR CLEANING OR CHEMICAL TREATMENT OR WORKPIECES

BACKGROUND OF THE INVENTION

The present invention relates to a device for cleaning or chemically treating parts, particularly printed circuit boards with solutions which are applied to the part or printed circuit board from nozzles.

Devices of the foregoing type are known and have been disclosed, for example in German patent publications DE-PS No. 26 06 984; DE-OS No. 35 28 575. Such known devices normally include a single slot-shaped nozzle chamber which has the disadvantage that in comparison with the transport portion of the device it has only a small part for individual treatment stages, which results in an insufficient treatment effect.

SUMMARY OF THE INVENTION

It is an object of the present invention to provide an improved device for cleaning or chemically treating parts, particularly printed circuit boards.

It is another object of the invention to provide a device which would ensure an increased material replacement on the parts being treated thus enhancing the useful part for the treatment stages of the process.

These and other objects of the invention are attained by a device for cleaning or chemically treating parts, particularly printed circuit boards, with solutions applied to a surface being treated, comprising an upper housing part provided with nozzles applying a solution to the surface being treated; a lower housing part positioned under said upper housing part and supplied with said solution and communicating with an interior of said upper housing part, said upper housing part including an upper wall formed with said nozzles, a separating wall subdividing said interior into two chambers, and perforated plane partitions each positioned in a respective chamber to limit the same from said upper wall, said nozzles being formed by two elongated slots provided in said upper wall.

The nozzle slots may angularly widen towards an upper face of said upper wall to form angular jets.

The device according to this invention renders it possible, in the advantageous manner, to ensure an extremely intensive cleaning of parts, particularly printed circuit boards. A further advantage of the device of the invention resides in a greater economizing of space utilized as compared to conventional devices of the type under discussion, particularly in continually running installations.

The device of the present invention is specifically suitable for cleaning or chemically treating boreholes of horizontally transported printed circuit boards whereby the effect of using the installation for individual treatment stages is increased in combination with reducing of the number of transport rollers for transporting the printed circuit boards. Furthermore, the entire length of the installation can be reduced.

The device according to this invention is also suitable for the activation and metallizing of such boreholes with the use of conventional activation and metallizing solutions.

It is advantageous that even very small such borehole, for example of a diameter 0.15 mm can be reliably conditioned, activated and/or metallized with respective solution.

Yet another advantage of the device according to the invention resides in that the metallizing, for example chemical copper plating, is substantially improved due to elimination of adherent water bubbles which can take place in many process stages without heating, and the metallizing of the supporting frame is eliminated also.

The sprayed jet advantageously starts from the plane or flat perforated partition provided with slots or bores or symmetrically or non-symmetrically positioned perforations and terminates at elongated slots of the nozzles.

Water, acids, such as sulfur acid, or chemical bases can be utilized as fluidic cleaning solutions. Conventional activation solutions, for example on the basis of noble metal solutions, such as palladium salt solutions, can be employed for the activation of printed circuit boards.

Conventional electroplating solutions can be employed for the chemical or galvanic metallization.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

BRIEF DESCRIPTION OF THE DRAWINGS

FIG. 1 is a partial sectional front view of the treatment device according to the invention;

FIG. 2 is a partial sectional top plan view of the device of FIG. 1;

DETAILED DESCRIPTION OF THE PREFERRED EMBODIMENT

Figure 3:
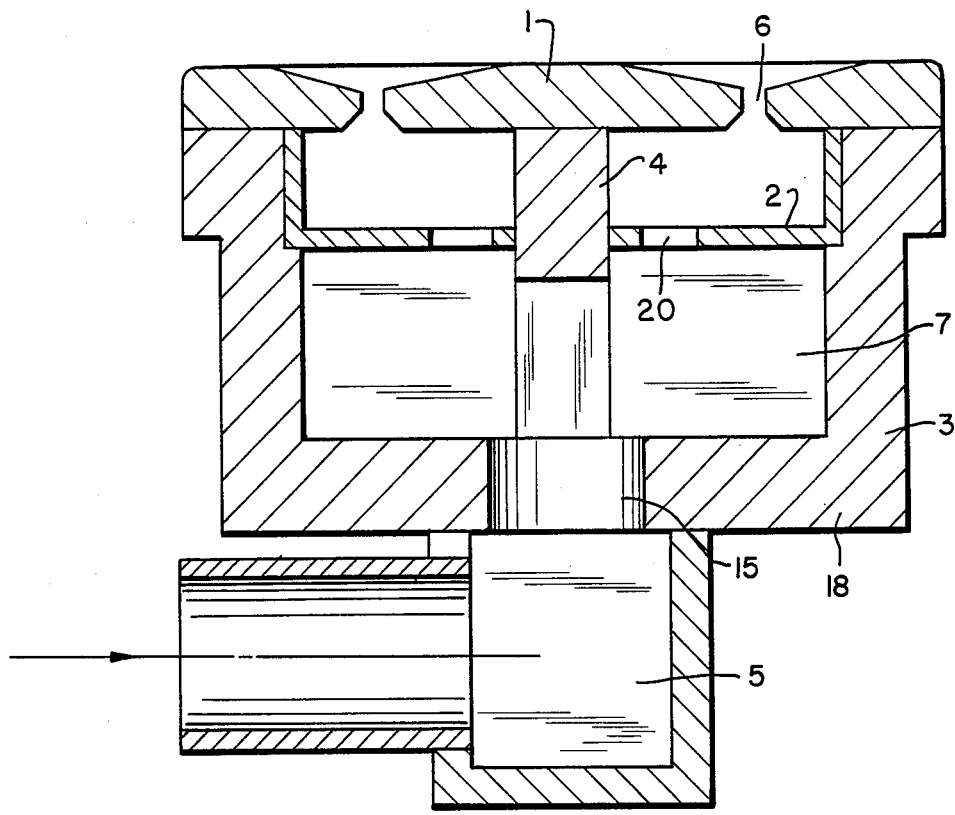
FIG. 3 is a sectional side view of the device of the invention.

Referring now to the drawings in detail it will be seen that the device for cleaning or treating plates, particularly printed circuit boards is comprised of a two-part housing, the first part of which is designated at 3 and is box-shaped and the second part 5 which is also box-shaped and is positioned below the upper housing part 3. The lower housing part 5 is a solution supplying part connected to a non-shown container with a treatment or cleaning solution. The solution flows from housing part 5 into the housing part 3 via a bore 15 in the bottom wall of the housing part 3.

Figure 4:
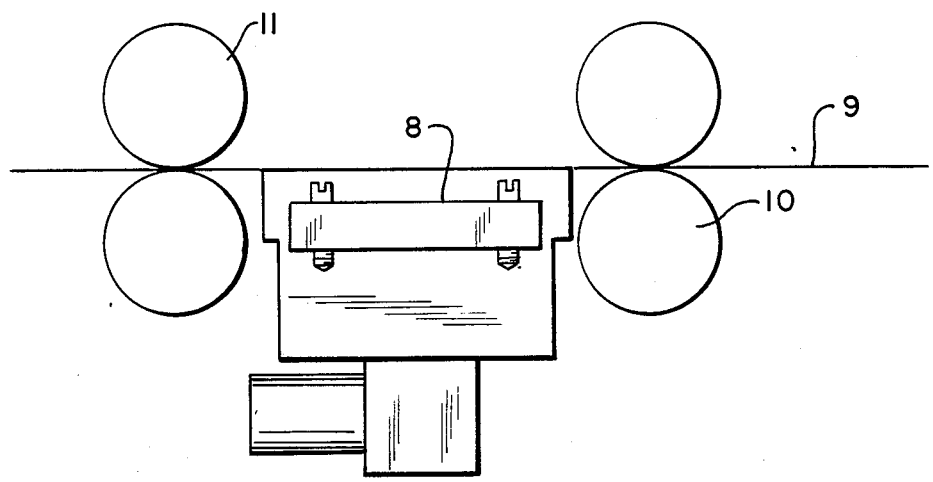
FIG. 4 is a schematic side view of the device with the regulating device provided at two sides of the treatment device of this invention.

Nozzles 6 for discharging a treatment solution from the upper housing part 3 are formed in an upper flood nozzle mask 1 to the upper face of which a printed circuit board 9 is applied by means of transport rollers 10 and counter pressure rollers 11 as shown in FIG. 4. The latter figure also shows an adjusting device 8 for adjusting the position of the device of the invention.

The upper housing part 3 is subdivided by means of a central partition or separating wall 4 into the two symmetrically positioned chambers 7. Each chamber has inserted therein a perforated plane wall or partition 2. Perforations 20 in walls 2 are seen in FIGS. 2 and 3; which shows the side view of the treatment device on enlarged scale.

The nozzles 6 are formed as elongated slots extending over the entire length of the device as shown in FIG. 2.

These slots are spraying nozzles which are formed to produce angular injection jets as seen in FIG. 3. Partitions 2 limit chambers 7 relative to the upper wall of the housing.

The device of the invention is particularly suitable for treating printed circuit boards which are employed in the electronic industry.

The mode of operation of the treatment device according to the invention is as follows:

The treatment liquid flows from the lower liquid-supplying housing part 5 through the bore or a number of bores 15 in the bottom wall 18 into the interior of the housing part 3, namely into its chambers 7. Due to the provision of the central separating wall 4 and two perforated partitions 2 the medium or the liquid flows through bores 20 to the slot-shaped nozzles 6 in two uniform sine-wave-shaped flows which optimally pass through the workpieces, particularly bores of printed circuit boards and ensure an intensive material interchange due to Venturi effect.

It will be understood that each of the elements described above, or two or more together, may also find a useful application in other types of devices for the cleaning or chemical treatment of printed circuit boards differing from the types described above.

While the invention has been illustrated and described as embodied in a device for the chemical treatment of printed circuit boards, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. A device for cleaning or chemically treating parts with solutions applied to a surface being treated, comprising an upper housing part which is elongated in a direction of elongation and provided with nozzles applying a solution to the surface being treated; a lower housing part which is also elongated in said direction of elongation and positioned under said upper housing part, said lower housing part being supplied with said solution and communicating with an interior of said upper housing part, said upper housing part including an upper wall formed with said nozzles, said lower housing part having an uninterrupted interior while said upper housing part is provided with a separating wall extending in said direction of elongation subdividing said interior of said upper housing part into two chambers, and perforated plane partitions each positioned in a respective chamber to limit the same from said upper wall, said nozzles being formed by two elongated slots provided in said upper wall and extending in said direction of elongation.

2. The device as defined in claim 1, wherein said slots angularly widen towards an upper face of said upper wall to form angular jets.

3. A device for cleaning or chemically treating printed circuit boards with solutions applied to a surface being treated, comprising an upper housing part which is elongated in a direction of elongation and provided with nozzles applying a solution to the surface being treated; a lower housing part which is also elongated in said direction of elongation and positioned under said upper housing part, said lower housing part being supplied with said solution and communicating with an interior of said upper housing part, said upper housing part including an upper wall formed with said nozzles, said lower housing part having an uninterrupted interior while said upper housing part is provided with a separating wall extending in said direction of elongation subdividing said interior of said upper housing part into two chambers, and perforated plane partitions each positioned in a respective chamber to limit the same from said upper wall, said nozzles being formed by two elongated slots provided in said upper wall and extending in said direction of elongation.

4. The device as defined in claim 3, wherein said slots angularly widen towards an upper face of said upper wall to form angular jets.

5. The device as defined in claim 4, wherein said slots extend along the entire length of said upper wall.

6. The device as defined in claim 4, wherein said slots also widen in the direction towards the interior of said upper housing part.

7. The device as defined in claim 3, wherein each partition has a plurality of holes positioned along said separating wall, said separating wall being disposed centrally longitudinally of said upper housing part.

8. The device as defined in claim 3, wherein said upper housing part and said lower housing part are box-shaped.

* * * * *